United States Patent
Cosci et al.

(10) Patent No.: US 6,281,677 B1
(45) Date of Patent: Aug. 28, 2001

(54) METHOD FOR DEFECT MARKING AND ANALYSIS OF THIN FILM HARD DISKS

(75) Inventors: Michael Craig Cosci, San Jose; Paul Marion Green, Morgan Hill; Lisa Ann Oliver, Milpitas, all of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/434,336

(22) Filed: Nov. 4, 1999

(51) Int. Cl.[7] ............................. G01R 33/12; G01N 27/72
(52) U.S. Cl. ................................. 324/212; 360/31; 369/58
(58) Field of Search ....................... 324/210, 211, 324/212, 216; 360/25, 31; 369/58

(56) References Cited

U.S. PATENT DOCUMENTS

| | | |
|---|---|---|
| 4,635,139 | 1/1987 | Nguyen et al. . |
| 4,896,277 | 1/1990 | Fountain et al. . |
| 5,168,412 | 12/1992 | Doan et al. . |
| 5,247,254 | 9/1993 | Huber et al. . |
| 5,581,021 | 12/1996 | Flechsig et al. . |

*Primary Examiner*—Walter E. Snow
(74) *Attorney, Agent, or Firm*—Robert O. Guillot; Oppenheimer Wolff & Donnelly LLP

(57) ABSTRACT

The present invention is a method for defect locating marking and analysis of thin film hard disks. Initially, the hard disk is disposed in a disk drive and the disk is formatted with sector identification lines and data written into data tracks. During the data writing process a disk surface defect is identified by its sector, track and byte location. The hard disk is then marked such that the defect can be located at a later time. The erased bands aid in later locating the defect. After the defect locating erasures have been completed for each defect found on the disk, the disk is removed from the hard disk drive for further analysis.

The disk is then placed on the stage of a microscope and ferromagnetic fluid is applied to the disk in order to make the erased tracks visible. The ferromagnetic fluid is applied out to the end of the track erasure of the track that includes the defect, without application of ferromagnetic fluid to the defect itself. As a result, the specific defect is visually located for further analysis in its original condition, without disk erasure over it, and without the application of ferromagnetic fluid upon it. Because the defect is in its original condition a more precise and accurate analysis of the nature of the defect can be made.

20 Claims, 4 Drawing Sheets

METHOD FOR DEFECT MARKING AND ANALYSIS OF THIN FILM HARD DISKS

BACKGROUND OF THE INVENTION

1. Field of the Invention

The present invention relates generally to methods for marking defects in thin film hard disks, and more particularly to the use of precise coordinates and DC erase on the hard disk to locate and identify the defect and utilizing ferromagnetic fluid for visual identification of the defect.

2. Description of the Prior Art

The detection, location and analysis of defects on the surface of hard disks has become an increasingly difficult problem where data bit sizes have decreased such that sub-micron sized asperities are of sufficient size to constitute defects. A read/write head may be used for the detection and location of such defects, as is taught in U.S. Pat. No. 4,635,139, entitled Asperity Burst Writer, issued Jan. 6, 1987 to Nguyen et al. Such asperity location and marking methods have provided adequate results in the past, however, the difficulty in locating and marking sub-micron sized defects has necessitated improved methods for disk marking for defect location. The present invention avoids writing, or erasing over a defect and avoids the application of ferromagnetic fluid on top of the defect where steps are taken to visually locate the defect.

SUMMARY OF THE INVENTION

The present invention is a method for defect locating, marking and analysis of thin film hard disks. Initially, the hard disk is disposed in a disk drive and the disk is formatted with sector identification lines and data written into data tracks. During the data writing process a disk surface defect is identified by its sector, track and byte location. The hard disk is then marked such that the defect can be located at a later time. The disk marking process includes erasing certain portions of the disk in the sector in which the defect is located. Significantly, the precise location of the defect is not erased. The disk marking process includes erasing the inner tracks of the sector in which the defect is located, erasing individual data tracks within the sector at intervals of approximately 30 tracks out to the track where the defect is located, and erasing a portion of the track in which the defect is located out to but not including the defect. Additionally, a band of adjacent tracks may be erased radially inwardly from the track in which the defect is located, and a second band of adjacent tracks may be erased radially outwardly from the track in which the defect is located. The erased bands aid in later locating the defect. After the defect locating erasures have been completed for each defect found on the disk, the disk is removed from the hard disk drive for further analysis.

The disk is then placed on the stage of a microscope and ferromagnetic fluid is applied to the disk in order to make the erased tracks visible. Initially, ferromagnetic fluid is applied to the inner tracks of the disk to locate sectors with inner track erasures as an indication that a defect exists in that sector. Next the ferromagnetic fluid is applied proximate the sector identification line radially outwardly such that the erased index lines visually appear. The ferromagnetic fluid is applied radially outwardly until the two erased bands of adjacent tracks become visible, such that the track containing the defect is disposed between the two erased bands. Thereafter the ferromagnetic fluid is applied to the erased portion of the track that includes the defect. The ferromagnetic fluid is applied out to the end of the track erasure, without application of ferromagnetic fluid to the defect itself.

As a result, the specific defect is visually located for further analysis in its original condition, without disk erasure over it, and without the application of ferromagnetic fluid upon it. Because the defect is in its original condition a more precise and accurate analysis of the nature of the defect can be made.

It is an advantage of the present invention that a disk having defects thereon can be marked for later location and analysis of the defects.

It is another advantage of the present invention that a disk having defects located thereon can be marked with DC erasure and exposed to ferromagnetic fluid, without DC erasure over the defect and without the application of ferromagnetic fluid to the defect.

It is a further advantage of the present invention that a method for locating defects on a hard disk in a disk drive has been developed in which the marking of defect locations is simple and automatically accomplished by the hard disk drive.

It is yet another advantage of the present invention that a method for marking and analysis of defects on a hard disk has been developed that is relatively rapid and simple to accomplish.

It is yet a further advantage of the present invention that a method for marking and analyzing defects on a hard disk has been developed in which the defects are analyzed in the original condition.

These and other advantages of the present invention will be well understood by those skilled in the art upon reviewing the following detailed description which makes reference to the several figures of the drawings.

IN THE DRAWINGS

DETAILED DESCRIPTION OF THE PREFERRED EMBODIMENTS

One of the steps that is undertaken following the assembly of a hard disk drive is to test each of the individual hard disks for defects. Where too many defects, or significant large defects are found, the entire hard disk drive may be rejected as being unacceptable for shipment to consumers. It is then desirable to analyze the defects on the hard disk to determine the nature of the defects. Depending upon the type of defect, modifications in one or more of the disk manufacturing steps can be undertaken to eliminate the defects from future disks, in order to improve the quality and throughput of future hard disk drives. The detection and analysis of defects becomes more significant and more difficult as the areal density of data storage on hard disks increases. Owing to the narrower data tracks and smaller bit sizes of modern high density hard disks, micron and sub-micron sized imperfections in the hard disk are large enough to constitute defects. The present invention is an improved method for locating and identifying defects on the hard disk during the hard disk drive testing procedure, coupled with an improved method for visually examining the defects following disassembly of a rejected disk drive.

Figure 1:
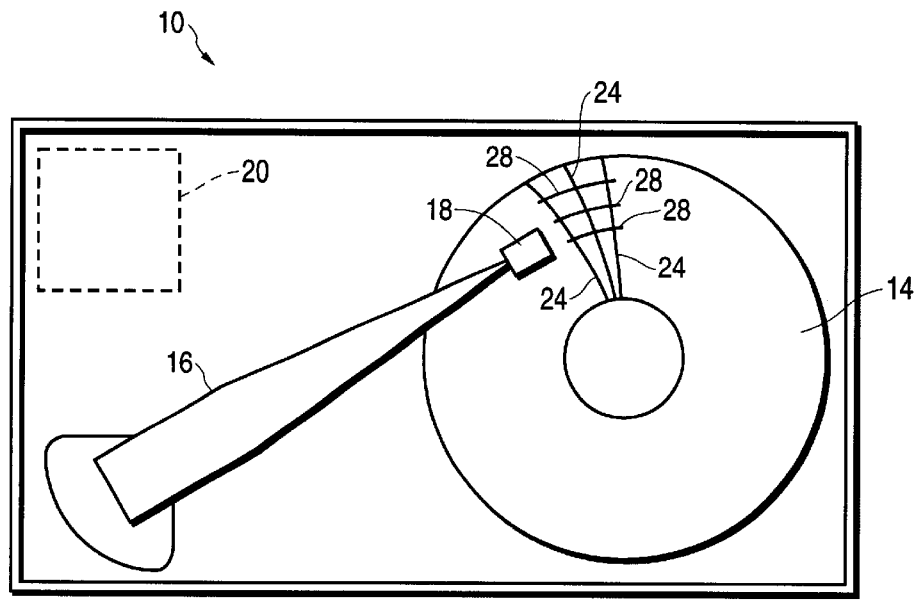
FIG. 1 is a top plan view depicting portions of a hard disk drive.

FIG. 1 is a top plan view of a hard disk drive 10 including at least one hard disk 14 and an actuator arm 16 having a read/write head 18 disposed at the distal end thereof. Disk drive control hardware and software 20, as is generally well known in the industry, are included within the hard disk drive 10. In the disk testing method of the present invention the hard disk 14 is formatted within the disk drive into a plurality of radially extending sectors (defined by sector identification lines 24) and a plurality of circumferential data tracks 28 with test data written into the tracks; a typical hard disk may be formatted with approximately 90 sectors and approximately 10,000 circular data tracks. As is well known, every point on the disk can be precisely located by the coordinates consisting of a sector identification number and a track number and a data byte location along the data track.

During the disk test procedure data is written to and read from the disk 14, and defects are detected by irregularities in the write/read process. Such defects may include bumps or pits on the disk surface, together with irregularities in the magnetic thin film layer of the disk. Utilizing computer software 20 within the hard disk drive that implements the method of the present invention, each hard disk surface within the hard disk drive is tested for defects according to the following methodology that is set forth in the flow chart of FIG. 2. A depiction of a disk illustrating the test methodology is presented in FIG. 3.

Figure 3:
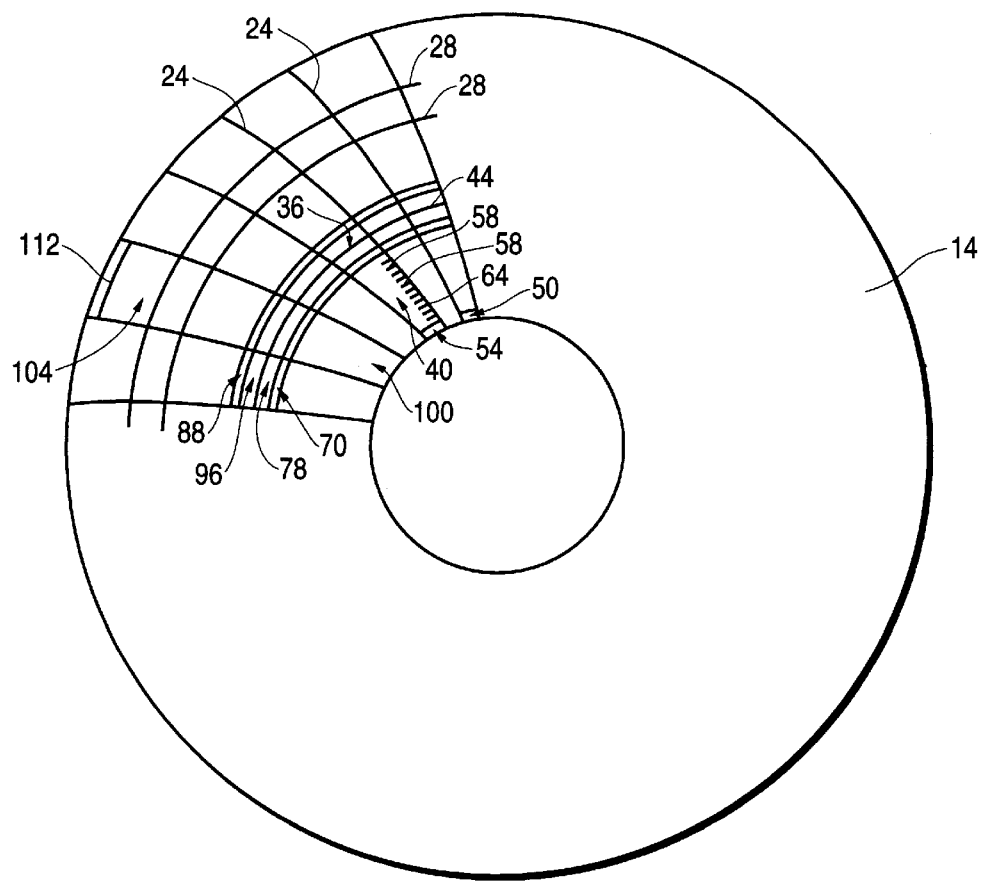
FIG. 3 is a top plan view of a hard disk having a defect and defect location markings shown thereon.
Figure 2:
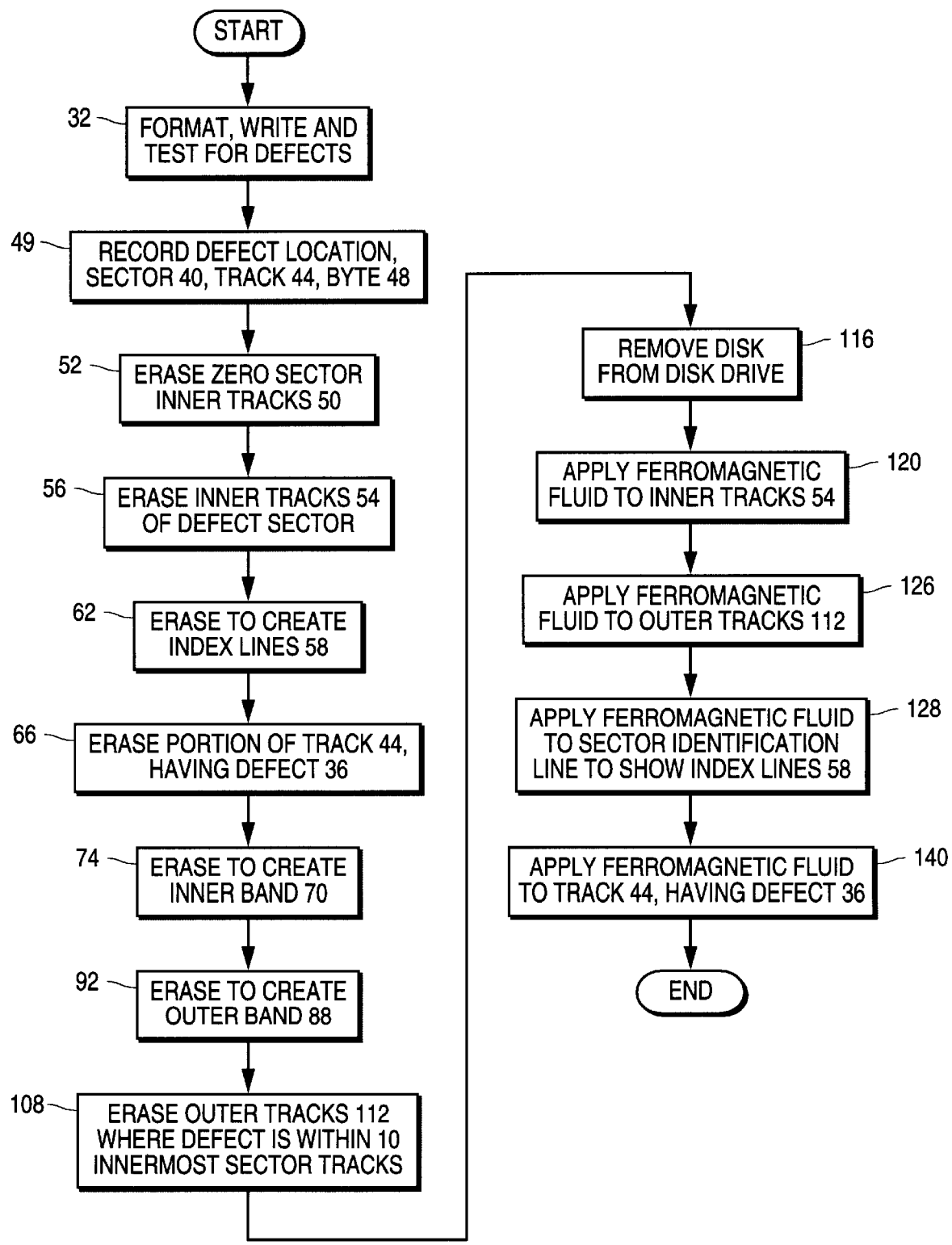
FIG. 2 is a process flow diagram of the present invention.

Referring to FIGS. 2 and 3, initially, the disk 14 is formatted with sector identification line 24 and data is written in tracks 28 which are individually tested 32 for defects. Where a defect 36 is located, the precise sector 40, track 44 and byte location 48 are recorded 49, and the following software driven steps are then undertaken by the hard disk drive 10. Firstly, as depicted in FIG. 3, the 20 inner tracks 50 of the first sector (the zero sector) are erased 52 utilizing a DC current, termed a DC erase step, to provide a starting sector marking. Thereafter, a plurality of adjacent inner tracks 54 within the specific sector 40 in which the defect 36 is located are DC erased 56 to identify the sector 40. Preferably approximately 10 inner tracks are DC erased. Thereafter, at pre-selected track intervals, such as approximately 30 tracks, index lines 58 are written 62 by DC erase of individual tracks from the previously formatted sector identification line 64 into the sector 40. The index lines 58 will later serve as a guide to the location of the defect 36, as is described herebelow. The DC erase index lines 58 are written 62 into the disk at the 30 track intervals out to the track 44 in which the defect 36 is located. When the write head 18 is located on the track 44 that includes the defect 36, the DC erase 66 is conducted in the track 44 up to, but not including, the data byte 48 that includes the defect 36. Thus the defect is not overwritten by the DC erase 66. Additionally, to further identify the location of the defect 36 for later analysis, a band of approximately 20 adjacent tracks 70 may be DC erased 74 radially inwardly from the track defect 44, while leaving an approximately 5 track band 78 of unerased disk, and a band of approximately 20 adjacent tracks 88 may be DC erased 92 radially outwardly of the defect track 44, again while leaving an approximately 5 track undisturbed band 96. Therefore, as is depicted in FIG. 3, the defect 36 and the disk areas 78 and 96 immediately surrounding the defect 36 are undisturbed, while disk bands 70 and 88 located inwardly and outwardly the defect area have been DC erased to aid in the future location and analysis of the defect 36.

Each other defect that is detected during the disk testing process is likewise identified for further analysis by the same methodology of DC erasing the 10 innermost tracks of the sector in which the defect is located, using the DC erase at 30 track intervals to create index lines out to the data track that includes the defect, DC erasing the track that includes the defect up to the defect but not erasing over the defect, and DC erasing a 20 track band at a 5 track radial interval on the inner and outer sides of the defect.

In the particular situation that a defect 100 is located within the ten innermost tracks of a sector 104, the erasing of the ten innermost tracks for sector identification is to be avoided as the erasure will detrimentally affect the later analysis of the defect. Therefore, where a defect 100 is located within the ten innermost tracks of a sector 104, the sector 104 is marked by DC erasing 108 the outermost ten tracks 112 of the sector 104.

It is to be understood that all of the defect detection and DC erasing is conducted rapidly and automatically by software 20 of the present invention that is installed within the hard disk drive 10. It is within the capability of ordinarily skilled hard disk software programmers to implement the DC erase strategy for defect location described above.

Figure 4:
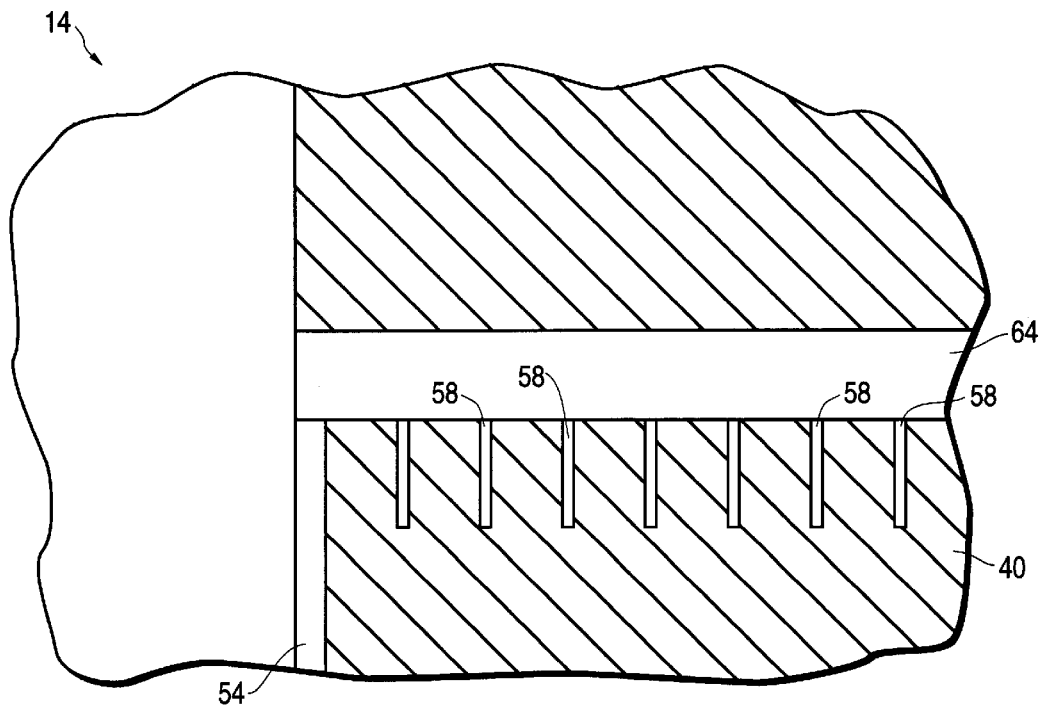
FIG. 4 is an enlarged plan view depicting the inner track marking of a sector having a defect disposed therein.

To analyze each of the detected defects, it is necessary to remove 116 the hard disk 14 from the hard disk drive 10. Following removal of the individual hard disk, it is to be understood that the DC erasures written onto the hard disk are not optically visible, and that the defects are of micon or sub-micron size. The disk 14 is next placed on a rotatable stage of a microscope and treated with ferromagnetic fluid dispensed from a micro Q-tip according to the following steps that make reference to FIGS. 4, 5 and 6, which are microscopic images of the disk 14 with ferromagnetic fluid therein. Initially, with the disk rotating slowly on the microscope stage, ferromagnetic fluid is applied 120 to the inner 10 tracks 54 of all sectors of the disk 14 and the inner 20 tracks 50 of the zero sector. As seen in FIG. 4, when the ferromagnetic fluid is applied, DC erased tracks 50 and 54 appear to be clear, or white, whereas tracks that have not been DC erased appear to be dark and are shown as shaded. Thus, as depicted in FIG. 4, the DC erased tracks 54 become visually perceptible when ferromagnetic fluid is applied to them and tracks 124, that were not DC erased, are dark shaded. Sectors in which no defect occurred were not exposed to a DC erase step, and the innermost 10 tracks of those sectors are not erased. Where the ten innermost tracks of a sector are not erased, it remains possible that a defect may be located within those ten innermost tracks of the sector. As indicated above, in such a situation the outermost ten tracks 112 of the sector will have been DC erased. Therefore, ferromagnetic fluid is also preferably applied 126 to the ten outermost tracks of sectors in which the ten innermost tracks are not erased. In this manner, a defect disposed within the ten innermost tracks of a sector will be identified for further analysis.

Figure 5:
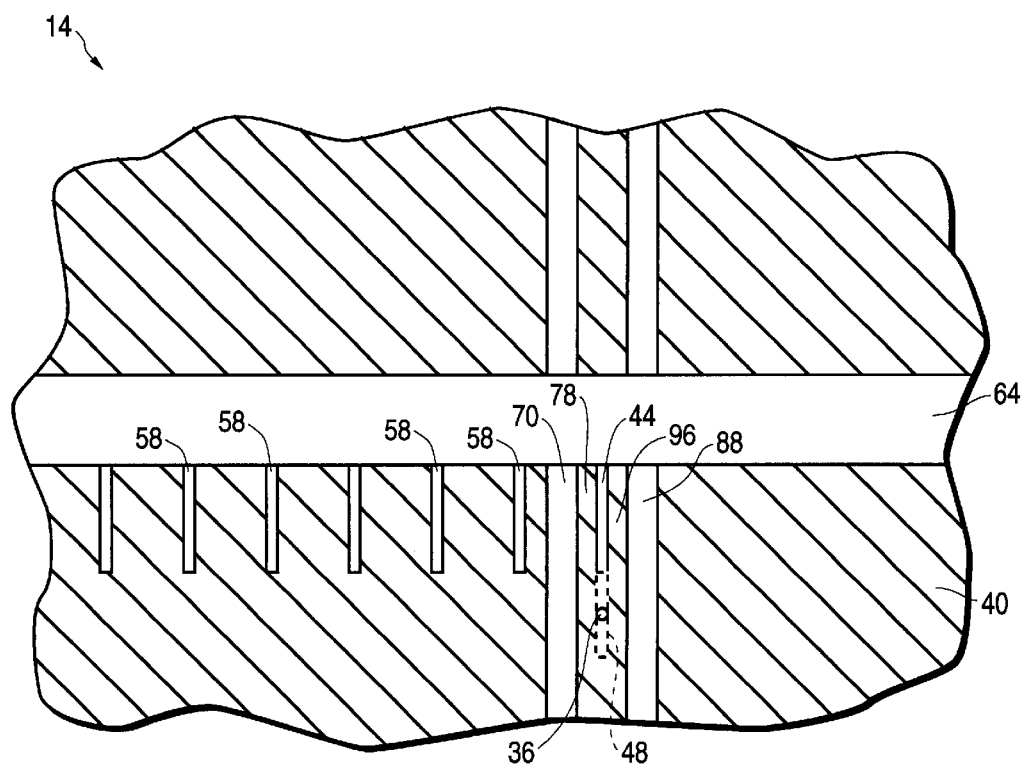
FIG. 5 is an enlarged plan view of a hard disk showing the erased index lines and inner and outer bands of erased tracks that aid in locating the defect.
Figure 6:
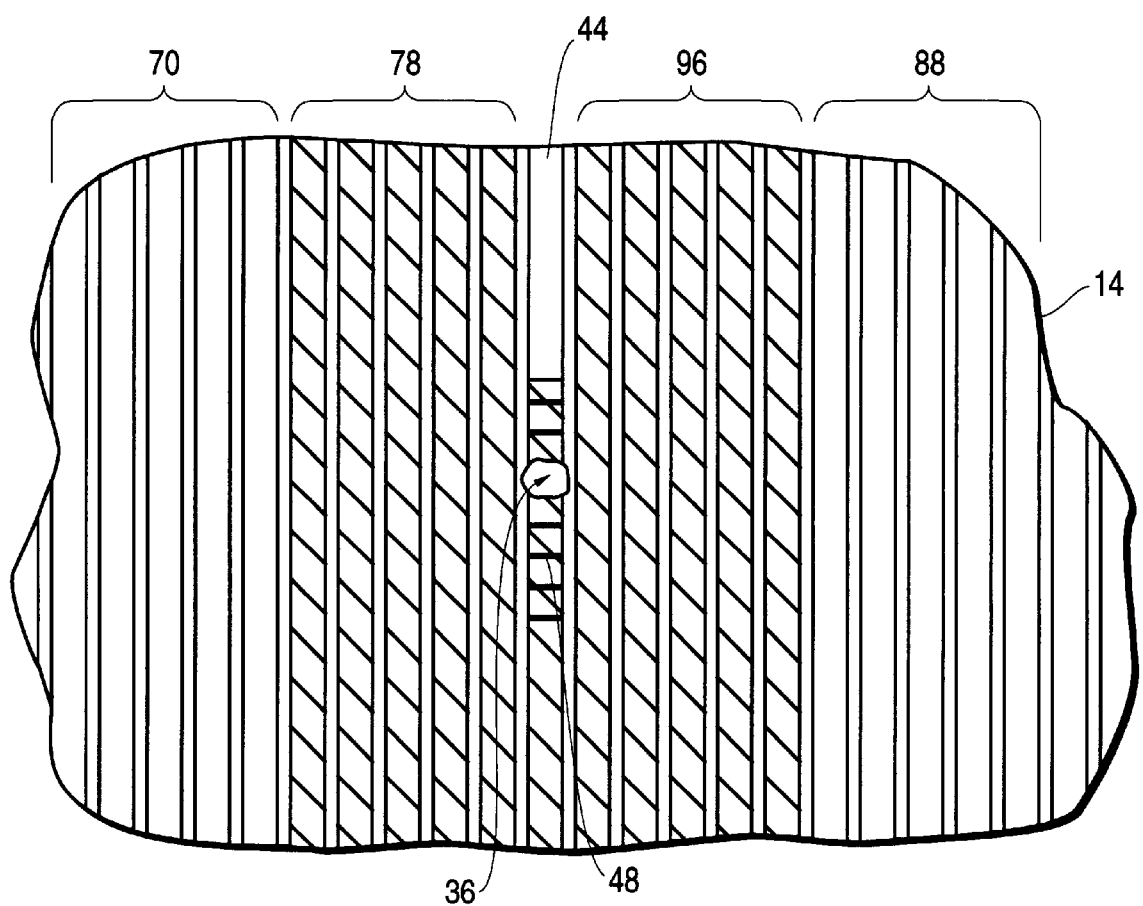
FIG. 6 is a further enlarged view depicting the defect and the erased track in which the defect is located.

Having identified a sector 40 in which the innermost 10 tracks 54 have been erased 56, with the disk stationary, ferromagnetic fluid is applied 128 radially outwardly along the sector identification line 64 of the sector 40. As depicted in FIG. 5, the application of the ferromagnetic fluid then optically reveals the DC erased index lines 58 that were written 62 at 30 track intervals out to the track 44 which includes the defect 36. The 20 track DC erased bands 70 and 88 that were written radially inwardly and outwardly respectively of the defect track 44 also become optically visible when the ferromagnetic fluid is applied to them. These bands 70 and 88 aid in optically identifying the individual data track 44 which includes the defect 36. The ferromagnetic fluid is next applied 140 to the individual data track 44 outward along the track to the end point 148 of the DC erase 66, as is seen in the enlarged view of FIG. 6. The defect 36 is now precisely visually located in the data byte 48 that follows the end point 148 of the track DC erase 66. Significantly, ferromagnetic fluid is not applied to the defect 36, although it has been utilized to locate the defect for visual microscopic inspection. Having located the defect 36 utilizing the method of the present invention, other analytical devices, such as an atomic force microscope, a magnetic force microscope and/or a scanning electron microscope can be utilized to provide detailed analytical data regarding the nature of the defect. Each defect on the disk can be precisely located and analyzed using the method described herein.

A significant advantage of this method is that DC erasure is not conducted over the defect, nor is ferromagnetic fluid applied over the defect. Rather, the method of the present invention facilitates the analysis of each defect in the condition in which it is found on the disk.

While the present invention has been shown and described with regard to certain preferred embodiments, it will be understood by those skilled in the art upon reading the preceding disclosure that certain alterations and modifications in form and detail may be made therein. It is therefore intended by the inventors that the following claims cover all such alterations and modifications that nevertheless include the true spirit and scope of the invention.

What is claimed is:

1. A method for defect marking and analysis of thin film hard disks, comprising the steps of:
    testing a formatted hard disk in a disk drive to locate a defect;
    determining the sector, track and byte location of said defect;
    erasing a portion of the sector in which said defect is located without erasing over said defect;
    removing the hard disk from the disk drive;
    applying ferromagnetic fluid to the hard disk to reveal said erased portion without applying said ferromagnetic fluid to said defect;
    whereby said erased portion with ferromagnetic fluid applied thereto provides visual markings to locate said defect.

2. A method for defect marking and analysis as described in claim 1 wherein said step of erasing a portion of the sector in which said defect is located includes erasing a plurality of adjacent inner tracks within said sector.

3. A method for defect marking and analysis as described in claim 1 wherein said step of erasing a portion of the sector in which said defect is located includes erasing a plurality of adjacent outer tracks within said sector.

4. A method for defect marking and analysis as described in claim 2 wherein said step of erasing a portion of the sector in which said defect is located includes erasing a plurality of spaced apart tracks within said sector from said adjacent inner tracks to said track in which said defect is located.

5. A method for defect marking and analysis as described in claim 4 wherein said step of erasing a portion of the sector in which said defect is located includes erasing a portion of said track in which said defect is located.

6. A method for defect marking and analysis as described in claim 5 wherein said step of erasing a portion of the sector in which said defect is located includes erasing a plurality of adjacent tracks disposed in a spaced apart relationship to said track in which said defect is located.

7. A method for defect marking and analysis as described in claim 6 wherein said plurality of adjacent tracks is disposed radially inwardly from said track in which said defect is located.

8. A method for defect marking and analysis as described in claim 7 wherein said step of erasing a portion of the sector in which said defect is located includes erasing a second plurality of adjacent tracks disposed in a spaced apart relationship radially outwardly from said track in which said defect is located.

9. A method for defect marking and analysis as described in claim 2 wherein said plurality of adjacent inner tracks includes approximately 10 tracks.

10. A method for defect marking and analysis as described in claim 3 wherein said plurality of adjacent outer tracks includes approximately 10 tracks.

11. A method for defect marking and analysis as described in claim 4 wherein said plurality of spaced apart tracks are disposed approximately 30 tracks apart.

12. A method for defect marking and analysis as described in claim 6 wherein said plurality of adjacent tracks includes approximately 20 tracks.

13. A method for defect marking and analysis as described in claim 12 wherein said approximately 20 adjacent tracks are disposed approximately 5 tracks away from said track in which said defect is located.

14. A method for defect marking and analysis as described in claim 7 wherein said plurality of adjacent tracks include approximately 20 tracks that are disposed approximately 5 tracks away from said track in which said defect is located.

15. A method for defect marking and analysis as described in claim 8 wherein said second plurality of adjacent tracks includes approximately 20 tracks.

16. A method for defect marking and analysis as described in claim 15 wherein said second plurality of adjacent tracks include approximately 20 tracks that are disposed approximately 5 tracks away from said track in which said defect is located.

17. A method for defect marking and analysis as described in claim 1 wherein said step of applying ferromagnetic fluid includes the steps of:
    mounting said disk upon the stage of a microscope;
    applying ferromagnetic fluid to the inner approximately 10 tracks of said disk;
    applying ferromagnetic fluid radially outwardly along a sector line of said sector in which said defect is located;
    applying ferromagnetic fluid to said track in which said defect is located.

18. A method for defect marking and analysis of thin film hard disks, comprising the steps of:
    testing a formatted hard disk in a disk drive to locate a defect;
    determining the sector, track and byte location of said defect;
    erasing a portion of the sector in which said defect is located without erasing over said defect; said erased portion of said sector including a plurality of adjacent inner tracks within said sector, a plurality of spaced apart tracks within said sector from said adjacent inner tracks to said track in which said defect is located, a portion of said track in which said defect is located, a plurality of adjacent tracks disposed radially inwardly in a spaced apart relationship from said track in which said defect is located, and a second plurality of adjacent tracks disposed in a spaced apart relationship radially outwardly from said track in which said defect is located;

removing the hard disk from the disk drive;

applying ferromagnetic fluid to the hard disk to reveal said erased portion without applying said ferromagnetic fluid to said defect;

whereby said erased portion provides visual markings to locate said defect.

19. A method for defect marking and analysis as described in claim 18 wherein said plurality of adjacent inner tracks includes approximately 10 tracks, said plurality of spaced apart tracks are disposed approximately 30 tracks apart, said plurality of radially inwardly disposed adjacent tracks includes approximately 20 tracks disposed approximately five tracks away from said track in which said defect is located, and said second plurality of adjacent tracks disposed radially outwardly from said track in which said defect is located includes approximately 20 tracks that are disposed approximately five tracks away from said track in which said defect is located.

20. A method for defect marking and analysis as described in claim 19 wherein said step of applying ferromagnetic fluid includes the steps of:

mounting said disk upon the stage of a microscope;

applying ferromagnetic fluid to the inner approximately 10 tracks of said disk;

applying ferromagnetic fluid radially outwardly along a sector identification line of said sector in which said defect is located;

applying ferromagnetic fluid to said track in which said defect is located without applying said ferromagnetic fluid to said defect.

* * * * *